United States Patent [19]

Stevens

[11] Patent Number: 5,111,263
[45] Date of Patent: May 5, 1992

[54] CHARGE-COUPLED DEVICE (CCD) IMAGE SENSOR OPERABLE IN EITHER INTERLACE OR NON-INTERLACE MODE

[75] Inventor: Eric G. Stevens, Rochester, N.Y.
[73] Assignee: Eastman Kodak Company, Rochester, N.Y.
[21] Appl. No.: 652,830
[22] Filed: Feb. 8, 1991
[51] Int. Cl.⁵ .................... H01L 29/78; H04N 3/14
[52] U.S. Cl. .................... 357/24; 358/213.19; 358/213.23; 358/213.31; 358/482
[58] Field of Search .............. 357/24, 24 LR; 358/213.19, 213.23, 213.31, 482

[56] References Cited

U.S. PATENT DOCUMENTS

| | | | |
|---|---|---|---|
| 4,117,514 | 9/1978 | Terui et al. | 358/213 |
| 4,571,625 | 2/1986 | Boudewijns | 358/213 |
| 4,638,361 | 1/1987 | Takeshita | 358/213 |
| 4,658,287 | 4/1987 | Chen | 358/48 |
| 4,672,453 | 6/1987 | Sakamoto | 358/213.23 |
| 4,680,636 | 7/1987 | Ooi | 358/213.18 |
| 4,740,828 | 4/1988 | Kinoshita | 358/48 |
| 4,805,026 | 2/1989 | Oda | 358/213.29 |
| 4,816,916 | 3/1989 | Akiyama | 358/213.29 |
| 4,975,777 | 12/1990 | Lee et al. | 358/213.19 |

*Primary Examiner*—Rolf Hille
*Assistant Examiner*—Wael Fahmy

[57] ABSTRACT

A charge-coupled device (CCD) image sensor, which can be operated either in the interlace mode or in the non-interlace mode, includes in a substrate of a semiconductor material a plurality of photodetectors, such as photodiodes, arranged in an array of rows and columns. A separate CCD shift register in the substrate extends along each column of the photodectectors. First and second sets of conductive gates extend transversely across the CCD shift registers with each first gate extending across a portion of the photodetectors in each row and each of the second gates extending across the remaining portion of the photodetectors in each row. A transfer region extends across the substrate from a portion of each of the photodetectors to an adjacent CCD shift register. The transfer regions of alternate photodetectors in each column extends under the first gates of the photodetectors and the transfer regions of the other photodetectors in each column extends under the second gates of the respective photodetectors.

18 Claims, 4 Drawing Sheets

CHARGE-COUPLED DEVICE (CCD) IMAGE SENSOR OPERABLE IN EITHER INTERLACE OR NON-INTERLACE MODE

FIELD OF THE INVENTION

The present invention relates to a charge-coupled device (CCD) image sensor, and, more particularly to a CCD image sensor which can be operated in either an interlace or non-interlace mode.

BACKGROUND OF THE INVENTION

CCD image sensors, in general, comprise a substrate of a semiconductor material having therein a plurality of photodetectors, such as photodiodes, arranged in an array of rows and columns, and a separate vertical CCD shift register extending along each column of the photodetectors. A horizontal CCD shift register extends across and is electrically connected to one end of each of the vertical CCD shift registers. Each of the vertical CCD shift registers includes a channel region in the substrate extending between and parallel to the columns of the photodetectors and conductive gates along and extending across the channel regions substantially parallel to the rows of the photodetectors. Each photodetector forms a pixel of the image sensor.

In the operation of the image sensor, the photodetectors receive illumination from the image being sensed during a scene integration period and convert the illumination to charge carriers which are temporally stored in the photodetectors. When the gates of the vertical CCD shift registers are properly pulsed, the charge carriers are transferred from the photodetectors to a channel region of the vertical CCD shift registers. Then by appropriately pulsing the gates, the charge carriers are transferred along the channel regions of the vertical CCD shift registers to the horizontal CCD shift register which carries the charge carriers to an output circuit.

For various uses of the image sensor, the vertical CCD shift registers are operated in either an interlace mode or a non-interlace mode. In the interlace mode, during the transfer period, the gates for a first set of alternating photodetectors in each column, such as the odd numbered photodetectors, are pulsed at one time to transfer the charge carriers from the odd numbered photodetectors to the channel region of the vertical CCD shift register. These charge carriers are then transferred along the vertical CCD shift registers to the horizontal CCD shift register. Then the gates for the other set of alternating photodetectors in each column, such as the even numbered photodetectors, are pulsed to transfer the charge carriers from the even numbered photodetectors to the channel regions of the vertical CCD shift registers. These charge carriers are then transferred along the vertical CCD shift registers to the horizontal CCD shift register. One major use of the interlace mode is in a camera for television since it is compatible with television operation.

In the non-interlace mode, the gates for all of the photodetectors in each column are pulsed at the same time. This results in the charge carriers for all of the photodetectors in each column being transferred at the same time to the channel regions of the vertical CCD shift registers. All of the charge carriers are then transferred to the horizontal CCD shift register. This mode provides a higher resolution of the image sensed and is used in still cameras and the like.

In order to have a CCD image sensor which is highly flexible and can be used for various purposes, it is desirable to have an image sensor which can be operated in either the interlace mode or the non-interlace mode. So far attempts to make such an image sensor have not been completely satisfactory. For example, U.S. Pat. No. 4,816,916 (I. Akiyama, issued Mar. 28, 1989), entitled "CCD Area Image Sensor Operable in Both of Line-Sequential and Interlace Scannings and a Method for Operating the Same" describes an image sensor which includes additional storage regions and electrodes to allow operation in both modes. This makes the image sensor more complex and therefore more expensive to manufacture. U.S. Pat. No. 4,805,026 (E. Oda, issued Feb. 14, 1989), entitled "Method for Driving a CCD Area Image Sensor in a Non-interlace Scanning and a Structure of the CCD Area Image Sensor for Driving in the Same Method" and the pending application for U.S. patent application Ser. No. 478,857 (D. L. Losee et al., filed Feb. 12, 1990), entitled "Selective Operation in Interlaced and Non-interlaced Modes of Interline Transfer CCD Image Sensing Device", each describe a method of a CCD image sensor in either interlace or non-interlace mode. However, these devices require extra gate electrodes and clock drivers as well as special clocking of the gates of the CCD shift registers and special circuits to carry out the clocking. Therefore, it would be desirable to have a CCD image sensor that has a relatively simple structure and can be operated in either interlace or non-interlace mode without special clocking circuits and which is of simple construction.

SUMMARY OF THE INVENTION

Viewed from one aspect, the present invention is directed to a CCD image sensor which comprises a plurality of photodetectors arranged in an array of at least one column, and a CCD shift register extending along the column of the photodetectors. The shift register includes two conductive gates for each photodetector. For one set of alternating photodetectors along the column one of the gates extends across the transfer region between the photodetectors and the CCD shift register, and for the other set of alternating photodetectors along the column the other of the gates extends across the transfer region. Thus, pulsing first the one gate of each photodetector and then pulsing the other gate operates the image sensor in the interlace mode, while pulsing all of the gates simultaneously operates the image sensor in the non-interlace mode. For the interlace mode of operation, one-half of the frame is read out after the first pulse. Then the second gate is pulsed and the second half of the frame is read out. For non-interlaced mode of operation, the entire frame is read out at the same time.

More particularly, the CCD image sensor of the present invention comprises a substrate of a semiconductor material having a surface. A plurality of photodetectors are in the substrate at the surface and are arranged in a column. A CCD shift register is in the substrate and extends along the column of photodetectors. A transfer region extends between a portion of each of the photodetectors and the adjacent CCD shift register. A set of first and second gates extends across the CCD shift register at each of the photodetectors. Each of the transfer regions of alternating photodetectors in the column extends under the first gate of its respective set of gates, and each of the transfer regions of the other photodetectors extends under the second gate of its respective set of gates.

Viewed from an other aspect, the present invention is directed to a charge-coupled device (CCD) image sensor. The CCD image sensor comprises a substrate of a semiconductor material having a surface, a plurality of photodetectors in said substrate at said surface, first and second sets of conductive gates, and a CCD shift register in said substrate at said surface and extending along the photodetectors which are arranged in a column. A separate transfer region exists in the substrate between a portion of each of said photodetectors and the CCD shift register. The first set of conductive gates extends across the CCD shift register with each of the first gates extending to a portion of a separate one of the photodetectors. The second set of conductive gates extends across the CCD shift register with each of the second gates extending to the remaining portion of a separate one of the photodetectors. The transfer regions of alternate ones of the photodetectors in the column extend under a separate one of the first gates, and the transfer regions of the other photodetectors in the column extend under a separate one of the second gates.

The invention will be better understood from the following more detailed description taken with the accompanying drawings.

It should be understood that the drawings are not necessarily to scale.

DETAILED DESCRIPTION

Figure 1:
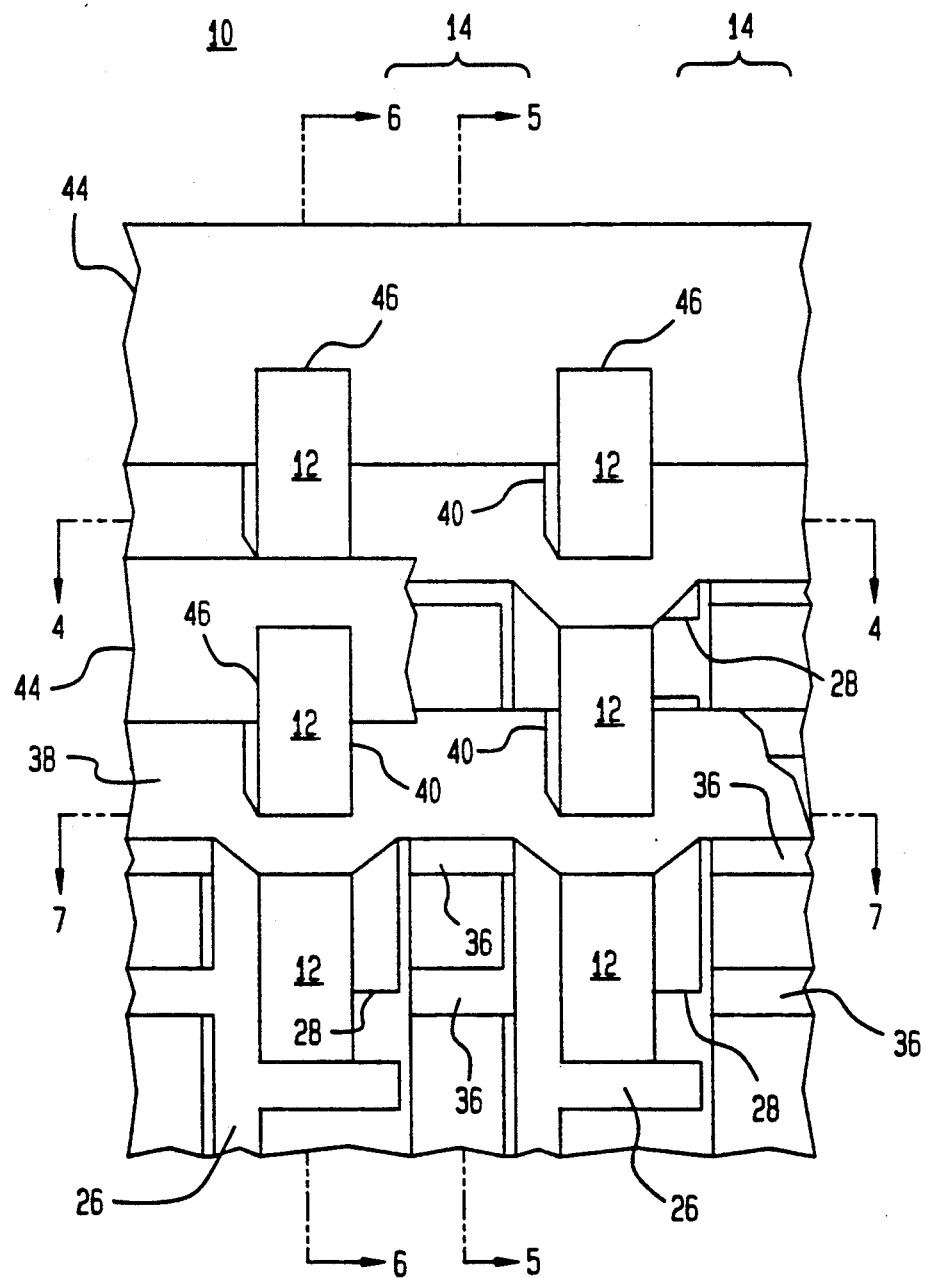
FIG. 1 is a partially broken away top plan view of a portion of the CCD image sensor in accordance with the present invention.
Figure 2:
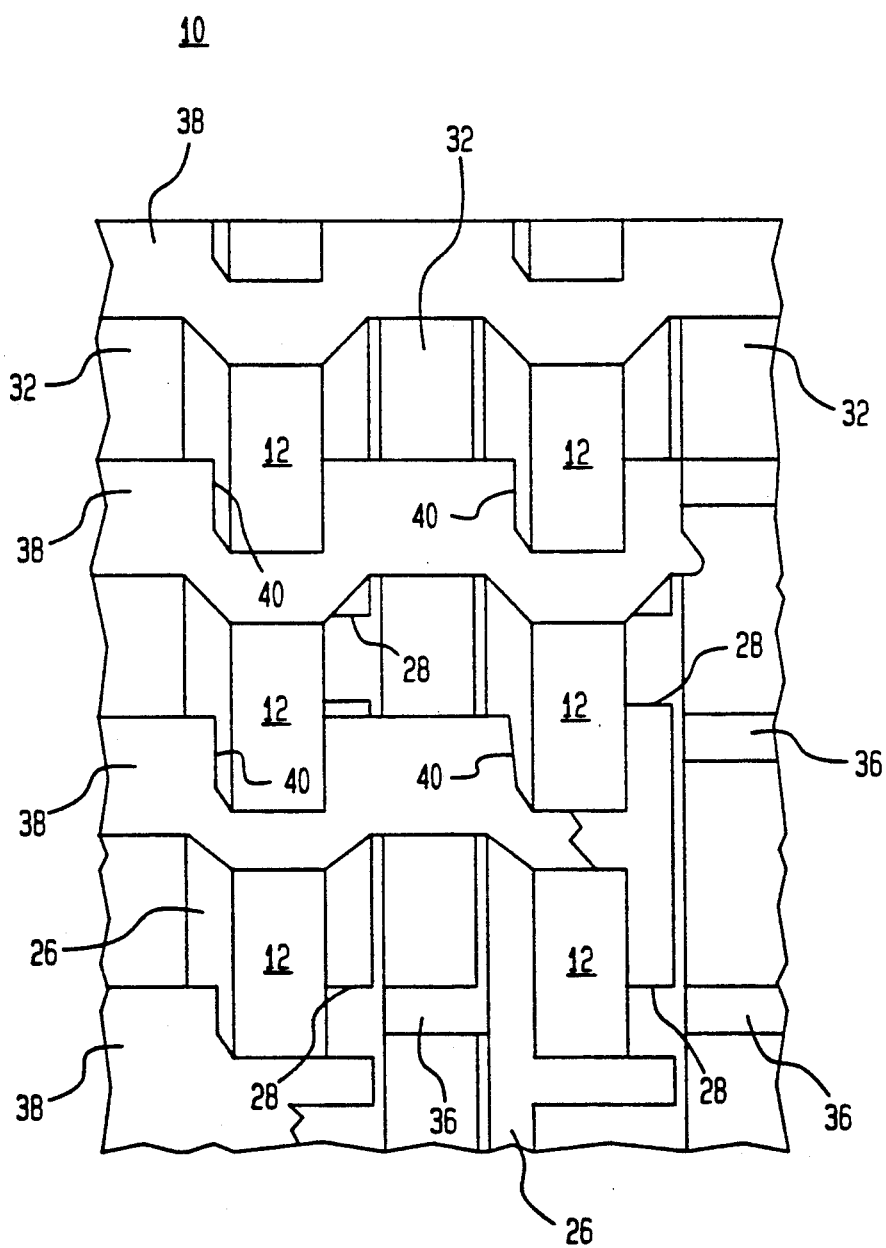
FIG. 2 is a top plan view similar to FIG. 1 with one set of gates removed.

Referring now to FIG. 1, there is shown a top plan view, partially broken away, of a charge-coupled device (CCD) image sensor 10 in accordance with the present invention. The image sensor 10 comprises a plurality of photodetectors 12 arranged in an array of rows and columns. Along each column of the photodetectors 12 is a vertical CCD shift register 14. The vertical CCD shift registers 14 are connected to a horizontal CCD shift register, not shown, which is connected to an output circuit, now shown. FIGS. 4, 5, 6 and 7 each show a sectional view of the CCD image sensor 10 of FIG. 1 taken along dashed lines 4—4, 5—5, 6—6 and 7—7, respectively of FIG. 1.

Figure 4:
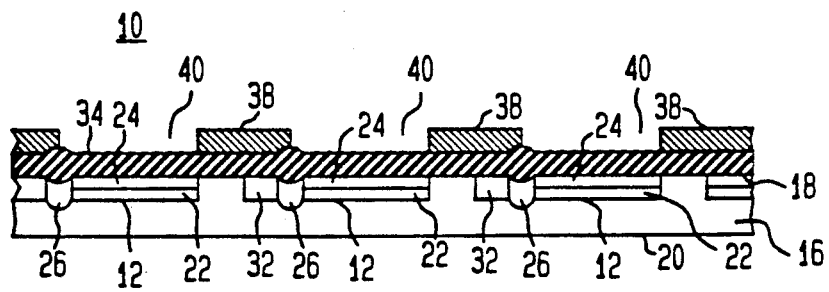
FIG. 4 is a sectional view taken along a dashed line 4—4 of FIG. 1.
Figure 5:
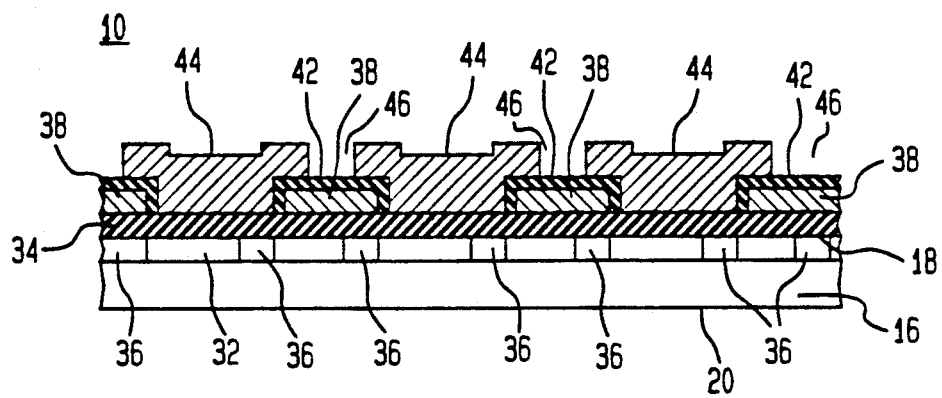
FIG. 5 is a sectional view taken along a dashed line 5—5 of FIG. 1.

The image sensor 10 is formed in a substrate 16 of a semiconductor material, such as single crystalline silicon, having opposed surfaces 18 and 20. The substrate 16 is preferably of p-type conductivity having a doping density of about $10^{15}$ impurities/cm$^3$. The photodetectors 12 are preferably pinned diodes of the type described in U.S. Pat. No. 4,527,182 (Y. Ishihara et al., issued July 2, 1985), entitled "Semiconductor Photoelectric Converter Making Excessive Charges Flow Vertically". As shown in FIG. 4, a pinned diode comprises a region 22 of n-type conductivity (typically having a doping concentration of about $10^{17}$ impurities/cm$^3$) in the substrate 16 adjacent the surface 18. A region 24 of highly conductive p-type conductivity (generally referred to as p+ type conductivity and having a doping concentration of about $10^{18}$ impurities/cm$^3$) is in the n-type region 22 and extends to the substrate surface 18.

Figure 3:
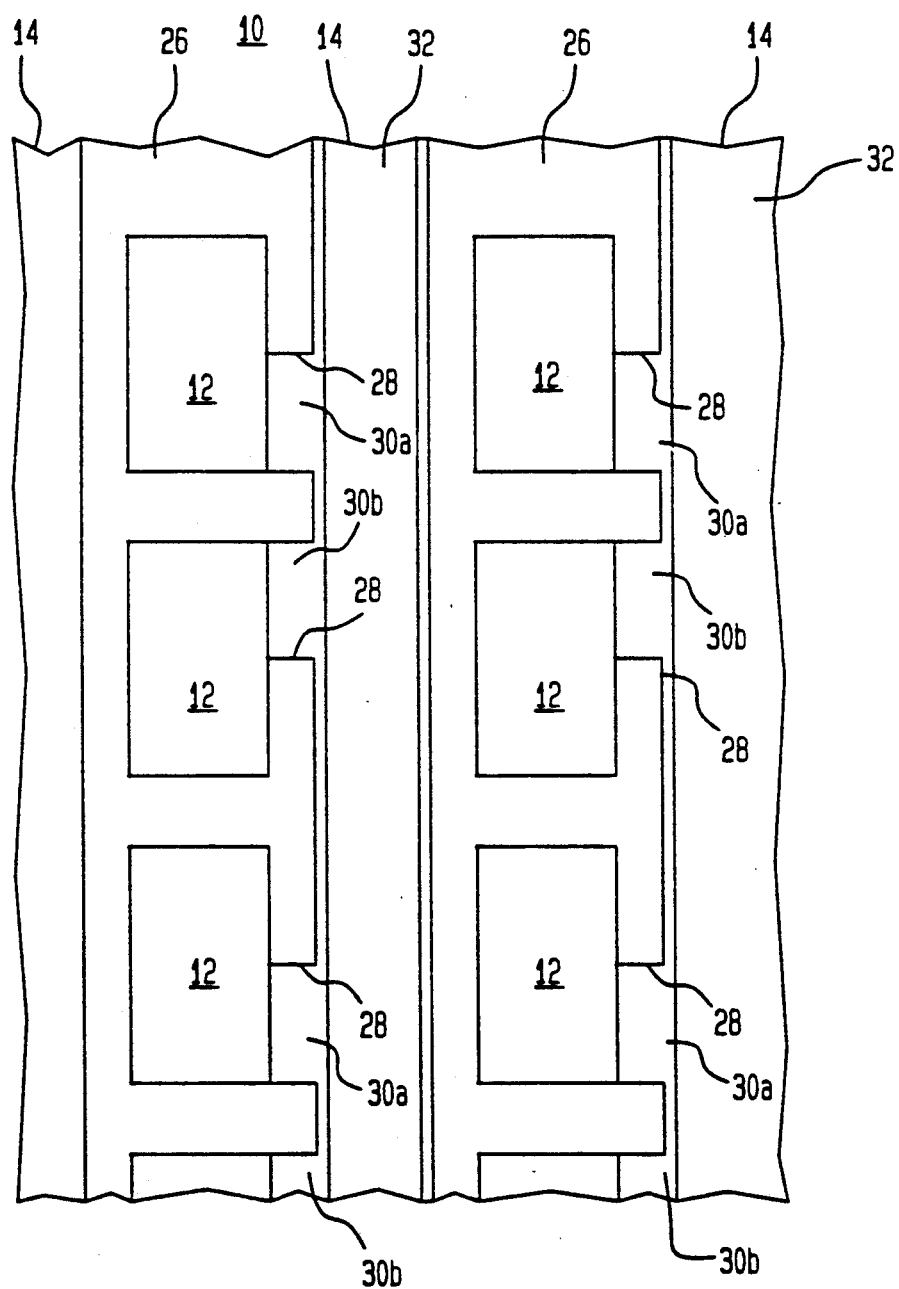
FIG. 3 is a top plan view similar to FIG. 1 with both sets of gates removed.
Figure 6:
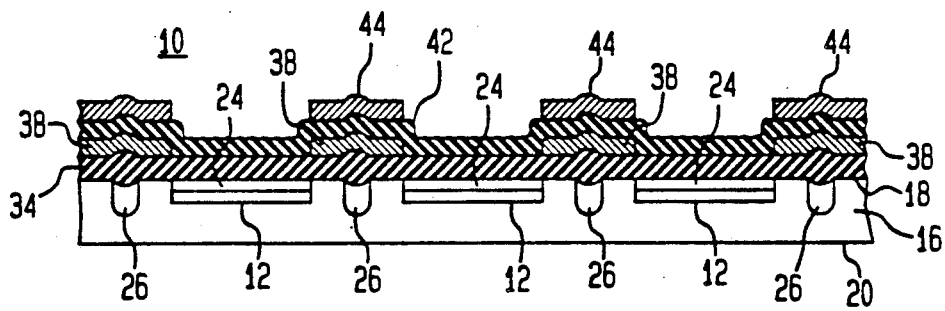
FIG. 6 is a sectional view taken along a dashed line 6—6 of FIG. 1.
Figure 7:
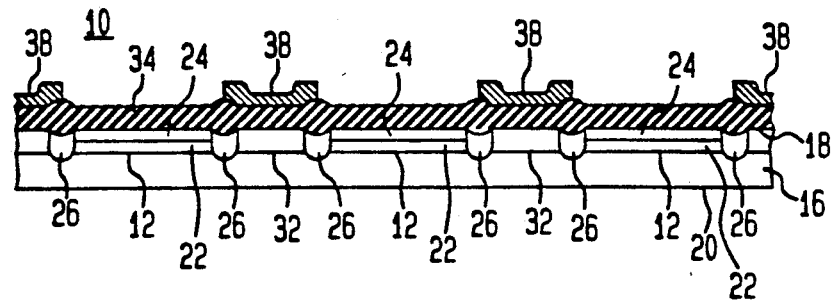
FIG. 7 is a sectional view taken along a dashed line 7—7 of FIG. 1.

As shown more clearly in FIG. 3, barrier regions 26 are around the photodetectors 12. As shown in FIGS. 4, 6, and 7, the barrier regions 26 are in portions of the substrate 16 and extend to the surface 18. The barrier regions 26 are of highly conductive p-type conductivity (generally referred to as p+ type conductivity and typically having a doping concentration of about $10^{18}$ impurities/cm$^3$). Along the side of each of the photodetectors 12 adjacent it respective CCD shift register 14, the barrier region 26 extends along only a portion of the photodetector 12, about one-half its length. This leaves an opening 28 through the barrier region 26 between the photodetector 12 and the CCD shift register 14 which serves as transfer regions 30a and 30b. As can be seen in FIG. 3, the transfer regions 30a for alternating photodetectors 12 in a column (i.e., the photodetectors in alternating rows) are along the lower half of the photodetectors 12 while for the remaining photodetectors 12 in a column (i.e., the photodetectors in the remaining rows) the transfer regions 30b are along the upper half of the photodetectors 12.

Each of the vertical CCD shift registers 14 comprises a channel region 32 of n-type conductivity (typically having a doping concentration of $10^{17}$ impurities/cm$^3$) in the substrate 16 and extending to and along the surface 18 between two columns of the photodetectors 12. The channel regions 32 are spaced from the adjacent columns of photodetectors 12 by the barrier regions 26. A layer 34 of an insulating material, typically silicon dioxide, is on the substrate surface 18 and extends across the channel regions 32 and the photodetectors 12. Spaced along each channel region 32 are a plurality of channel transfer regions 36 which extend laterally across the channel region 32. The channel transfer regions 36 are lightly doped with a p-type conductivity impurity so that the channel transfer regions are of low n-type conductivity (generally referred to as n/type conductivity. The channel transfer regions 36 are positioned so that there are two of the channel transfer regions 36 at each photodetector 12.

A first set (plurality) of separated conductive gates 38 are on the insulating layer 34 and extend transversely across the channel regions 32 and the photodetectors 12. The first gates 38 are of a width and are positioned to extend across the lower half of the photodetectors 12 in each row. The first gates 38 have openings 40 therethrough over each of the photodetectors 12 so as to expose the photodetectors 12. In the alternating rows of the photodetectors 12 where the photodetectors 12 have a transfer region 30b at their lower portions, the first gates 38 extend across the transfer regions 30b. The first gates 38 also extend across the channel transfer regions 36 which are half way along the length of the photodetectors 12. Each such transfer region 36 is self-aligned to the proximal edge of its respective first gate 38. The first gates 38 are made of any conductive material, such as a metal or doped polycrystalline silicon.

The first gates 38 are coated with a layer 42 of an insulating material, typically silicon dioxide.

A second set (plurality) of separated conductive gates 44 are on the insulating layer 34 and extend transversely across the channel regions 32 and the photodetectors 12. Each second gate extends across a row of the photodetectors 12 and between a pair of the first gates 38. Thus, each of the second gates 44 extends across the upper half of the photodetectors 12 in each row so that in the alternating rows of the photodetectors 12 where the transfer region 30a is at the upper portion of the photodetector 12, the second gate 44 extends across the transfer region 30a. The second gates 44 have openings 46 therethrough over the photodetectors 12 so as to expose the photodetectors 12. Also, the second gates 44 extend across the channel transfer regions 36 which are at the ends of the photodetectors 12 with each of such transfer regions being self-aligned to the proximal edge of its respective second gate 44. As shown in FIG. 6, the second gates 44 overlap the first gates 38 over the portions of the barrier regions 26 which are between the photodetectors 12 in each column. The gates 38 and 44 are insulated from each other by the insulating layer 34. The second gates 44 are also of any conductive material, such as a metal or doped polycrystalline silicon. The two sets of gates 38 and 44 form a two-phase CCD shift register.

In the operation of the image sensor 10, during the scene integration period, radiation impinging on the photodetectors 16 is converted to charge carriers. During the transfer period, a potential is applied to the gates 38 and 44. For the gates 38 and 44 which extend over a transfer region 30a and 30b, this potential applied to the gates 38 and 44 creates a potential well in the respective transfer region 30a and 30b which is deeper than the potential level in the photodetectors 16. This results in the charge carriers in the photodetectors 16 flowing across the transfer regions 30a and 30b into the channel region 32 of the adjacent CCD shift register 14. The gates 38 and 44 are then pulsed alternately to cause the charge carriers to move along the channel region 32 to the horizontal CCD shift register, not shown, at the ends of the vertical CCD shift registers 14. The horizontal shift register is then operated to carry the charge carriers to an output circuit.

To operate the image sensor 10 in an interlace mode, a potential is applied first to only one set of the gates, such as the first set 38. Since the first set of gates 38 extend over the transfer region 30a of only every other photodetector 16 in a column, the charge carriers from only every other photodetector 16 in each column is transferred to the channel region 32 of its respective CCD shift register 14. These charge carriers are then transferred along the vertical CCD shift registers 14 to the horizontal shift register. Thus, one-half of the frame is read out. Then a potential is applied to the second set of gates 44. The second set of gates 44 extend across the transfer regions 30b of the alternating photodetectors 16 in each column between those over which the first set of gates 42 extend. Thus, the charge carriers from the remaining alternate photodetectors is transferred to the channel region 32 of its respective vertical CCD shift register 14. These charge carriers are then transferred along the vertical CCD shift registers 14 to the horizontal CCD shift register. Thus, the other half of the frame is read out. Thus, by alternately pulsing (clocking) the first and second set of gates 38 and 44, the charge carriers from first one set of alternate photodetectors 16 in each column and then from the other set of alternate photodetectors 16 are transferred to the vertical CCD shift registers 14 so that the image sensor is operated in an interlace mode.

To operate the image sensor 10 in a non-interlace mode, it is only necessary to apply a potential to both sets of gates 38 and 44 at the same time. This applies a potential to the transfer region 30a and 30b of all the photodetectors 16 in each column so as to deepen the potential well in all of the transfer regions 30a and 30b. Thus, the charge carriers from all of the photodetectors 16 in each column are transferred to the channel region 32 of their respective vertical CCD shift register 14 simultaneously. The two sets of gates 38 and 44 are then pulsed (clocked) alternately to move the charge carriers along the channel regions 32 to the horizontal CCD shift register.

Thus, there is provided by the present invention an image sensor 10 which can be operated in either an interlace mode or a non-interlace mode by merely changing the manner in which the gates 38 and 44 are pulsed. For an interlace mode the gates 38 and 44 are pulsed alternately and for a non-interlace mode the gates 38 and 44 are pulsed all at the same time. This variation in the manner that the gates are pulsed can be achieved with a single drive circuit with only the timing being changed so as to greatly simplify the circuitry required for operating the CCD sensor 10. Also, this is achieved simply in the structure of the image sensor 10 by merely varying the position of the transfer regions 30a and 30b for the photodetectors 16. This requires only a change in the design of the mask used to form the barrier region 26 and does not require any additional processing steps. Thus, image sensor 10 of the present invention achieves either an interlace or non-interlace mode of operation and can be made with at essentially the same cost as standard CCD image sensors.

It is to be appreciated and understood that the specific embodiments of the invention are merely illustrative of the general principles of the invention. Various modifications may be made consistent with the principles set forth. For example, although the image sensor has been described as having pinned diode photodetectors, any well known type of photodetector can be used. Also, although the CCD shift registers are described as being of the buried channel type, any other design of CCD shift register can be used which has two sets of gates. Additionally, the substrate can be of other suitable semiconductor materials used for image sensors.

What is claimed is:

1. A CCD image sensor comprising:
    a substrate of a semiconductor material having a surface;
    a plurality of photodetectors in said substrate at said surface, said photodetectors being arranged in a column;
    a CCD shift register in said substrate at said surface and extending along said column of photodetectors;
    a separate transfer region in said substrate between only a portion of each of said photodetectors and the CCD shift register;
    a set of first and second conductive gates extending across the CCD shift register at each of said photodetectors; and
    each of the transfer regions of alternate photodetectors in the column extending under only the first gate of its respective set of gates, and each of the transfer regions of the other photodetectors in the column extending under only the second gate of its respective set of gates.

2. The CCD image sensor of claim 1 in which the CCD shift register comprises a channel region extending along the surface of the substrate adjacent to but spaced from the column of photodetectors, the transfer regions extend to the channel region, and the gates extend laterally across the channel region.

3. The CCD image sensor of claim 2 in which the substrate is of one conductivity type and the channel region is a region in the substrate of the opposite conductivity type.

4. The CCD image sensor of claim 2 further comprising a barrier region around each of said photodetectors, said barrier region having openings therethrough along a portion of the side of each photodetector adjacent the channel region of the CCD shift register, the portion of the substrate in said openings forming the transfer regions between the photodetectors and the channel region.

5. The CCD image sensor of claim 4 in which the substrate is of one conductivity type and the barrier region is a region of the one conductivity type but of higher conductivity than the substrate in the substrate at said surface.

6. The CCD image sensor of claim 4 in which the first gate of each set of gates extends transversely across a portion of its respective photodetector, and the second gate of each set of gates extends across the remaining portion of its respective photodetectors, the openings in the barrier region along alternate photodetectors in the column are under the first gate of the respective photodetector, and the openings in the barrier region along the other photodetectors in the column are under the second gate of the respective photodetector.

7. The CCD image sensor of claim 6 in which each of the gates has an opening therethrough over its respective photodetector.

8. The CCD image sensor of claim 7 further comprising a layer of an insulating material on the said surface of the substrate and the gates are on the insulating layer.

9. The CCD image sensor of claim 8 in which each of the photodetectors comprises a diode having a first region of one conductivity type in the substrate at said surface and a second region of the opposite conductivity type in said first region at said surface.

10. A CCD image sensor comprising:
a substrate of a semiconductor material having a surface;
a plurality of photodetectors in said substrate at said surface, said photodetectors being arranged in an array of spaced rows and columns;
a plurality of CCD shift registers in said substrate with each CCD shift register extending along a separate column of the photodetectors;
a transfer region between only a portion of each of said photodetectors and its adjacent CCD shift register;
a separate set of first and second conductive gates extending transversely across the CCD shift registers and the photodetectors in each of the rows;
the transfer regions of alternate photodetectors in each column extending under only the first gate of its respective set of gates, and the transfer regions of the other photodetectors in each column extending under only the second gate of its respective set of gates.

11. The CCD image sensor of claim 10 in which each of the CCD shift registers comprises a channel region extending along the surface of the substrate adjacent to but spaced from a column of the photodetectors and the transfer regions extend to the channel regions.

12. The CCD image sensor of claim 11 in which the substrate is of one conductivity type and the channel regions are regions in the substrate at said surface of the opposite conductivity type.

13. The CCD image sensor of claim 11 further comprising a separate barrier region around the photodetectors in each column, said barrier regions having openings therethrough along a portion of each of the photodetectors adjacent the channel region of the adjacent CCD shift register, the portion of the substrate in said openings forming the transfer regions between the photodetectors and the channel regions.

14. The CCD image sensor of claim 13 in which the substrate is of one conductivity type and the barrier regions are regions of the one conductivity type but of higher conductivity than the substrate in the substrate and at said surface.

15. The CCD image sensor of claim 13 in which each of the first gate of each set extends transversely across a portion of the photodetectors in its respective row, the second gate of each set extends transversely across the remaining portion of the photodetectors in its respective row, each of the openings in the barrier regions along alternate photodetectors in each column is under its respective first gate, and each of the openings in the barriers regions along the other photodetectors in each column is under its respective second gate.

16. The CCD image sensor of claim 15 in which each of said gates has an opening therethrough over each of the photodetectors in its respective row.

17. The CCD image sensor of claim 16 further comprising a layer of an insulating material on said surface of the substrate and the gates are on said insulating material layer.

18. The CCD image sensor of claim 17 in which each of the photodetectors comprises a diode having a first region of one conductivity type in the substrate at said surface and a second region of the opposite conductivity type in said first region at said surface.

* * * * *